(12) United States Patent
McLaren et al.

(10) Patent No.: US 9,335,500 B2
(45) Date of Patent: May 10, 2016

(54) HYBRID ELECTRO-OPTICAL PACKAGE FOR AN OPTO-ELECTRONIC ENGINE

(75) Inventors: Moray McLaren, Bristol (GB); Paul Kessler Rosenberg, Sunnyvale, CA (US); Michael Renne Ty Tan, Menlo Park, CA (US); Terrel Morris, Garland, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 54 days.

(21) Appl. No.: 14/365,294

(22) PCT Filed: Jan. 31, 2012

(86) PCT No.: PCT/US2012/023219
§ 371 (c)(1),
(2), (4) Date: Jun. 13, 2014

(87) PCT Pub. No.: WO2013/115780
PCT Pub. Date: Aug. 8, 2013

(65) Prior Publication Data
US 2015/0003841 A1 Jan. 1, 2015

(51) Int. Cl.
*H04B 10/25* (2013.01)
*G02B 6/43* (2006.01)
*G02B 6/42* (2006.01)
*H01L 25/16* (2006.01)

(52) U.S. Cl.
CPC ............ *G02B 6/43* (2013.01); *G02B 6/4206* (2013.01); *G02B 6/428* (2013.01); *G02B 6/4214* (2013.01); *G02B 6/4257* (2013.01); *H01L 25/16* (2013.01); *H04B 10/2504* (2013.01); *H01L 2224/16225* (2013.01); *H01L 2224/73253* (2013.01); *H01L 2924/15192* (2013.01)

(58) Field of Classification Search
None
See application file for complete search history.

(56) References Cited

U.S. PATENT DOCUMENTS

| 6,661,661 B2 | 12/2003 | Gaynes et al. |
| 6,749,345 B1 | 6/2004 | Gee et al. |
| 6,999,312 B1 | 2/2006 | Garnett et al. |
| 7,023,705 B2 | 4/2006 | Liu et al. |

(Continued)

FOREIGN PATENT DOCUMENTS

| CN | 1333279 C | 8/2007 |
| TW | 200922432 A | 5/2009 |
| WO | WO-2012096651 A1 | 7/2012 |

OTHER PUBLICATIONS

International Search Report and Written Opinion, Aug. 28, 2012, PCT Patent Application No. PCT/US2012/023219, 10 pages.

*Primary Examiner* — Darren E Wolf
(74) *Attorney, Agent, or Firm* — Wagner Blecher L.L.P.

(57) ABSTRACT

A hybrid electro-optical package for an opto-electronic engine. The package includes a carrier substrate, and a package base. Electrical vias and an optical via of the carrier substrate communicate between a back side and a front side of the carrier substrate. The package base is coupled to the carrier substrate by intra-package electrical interconnects. The carrier substrate is to interconnect electrically with an opto-electronic component mounted on its back side, and includes an optical aperture at its front side for communication of optical signals. Similarly, lands disposed at a front side of the package base provide for communication of electrical signals to an integrated circuit and the opto-electronic component. A system and an opto-electronic engine that include the hybrid electro-optical package are also provided.

15 Claims, 10 Drawing Sheets

(56) References Cited

U.S. PATENT DOCUMENTS

| | | |
|---|---|---|
| 7,042,082 B2 | 5/2006 | Epitaux et al. |
| 7,382,946 B2 | 6/2008 | Oggioni et al. |
| 7,486,847 B1 | 2/2009 | Dellmann et al. |
| 7,703,993 B1 | 4/2010 | Darbinyan et al. |
| 8,043,877 B2 | 10/2011 | Badehi et al. |
| 2003/0123231 A1* | 7/2003 | Shah .................... H05K 7/1061 361/748 |
| 2005/0135732 A1* | 6/2005 | Crow ....................... G02B 6/43 385/15 |
| 2007/0023904 A1 | 2/2007 | Salmon |
| 2007/0297713 A1 | 12/2007 | Lu et al. |
| 2008/0251943 A1* | 10/2008 | Corisis ............. H01L 23/49827 257/778 |
| 2010/0151614 A1 | 6/2010 | Darbinyan et al. |
| 2010/0225006 A1 | 9/2010 | Haba et al. |

\* cited by examiner

HYBRID ELECTRO-OPTICAL PACKAGE FOR AN OPTO-ELECTRONIC ENGINE

RELATED APPLICATIONS

This Application is related to PCT Patent Application, Serial Number PCT/US2011/020785 by Michael Renne Ty Tan, et al., filed on Jan. 11, 2011, entitled "PASSIVE OPTICAL ALIGNMENT," and assigned to the assignee of the present technology.

TECHNICAL FIELD

Examples of the present technology relate generally to interfaces, such as electro-optical packages, for opto-electronic engines, and systems including opto-electronic engines.

BACKGROUND

As the band-width in data processing and communications grows, engineers and scientists engaged in data systems design have turned with increasing interest to fiber optics as a means for providing data processing and communications with high band-width. Thus, vertical-cavity, surface-emitting lasers (VCSELs) and photo-diodes coupled to optical waveguides, for example, optical fibers, in arrays of optical transmitters and optical receivers, respectively, are finding increasing application as means for providing high band-width data processing and communication. Thus, as engineers and scientists have become more engaged in research and development of systems utilizing such optical waveguides, VCSELs and photo-diodes, their attention has increasingly turned towards designing such systems with high reliability and low cost, to meet the increasing challenges presented by data processing and communications at high band-widths.

DESCRIPTION OF THE DRAWINGS

The accompanying drawings, which are incorporated in and form a part of this specification, illustrate examples of the technology and, together with the description, serve to explain the examples of the technology.

Figure 1A:
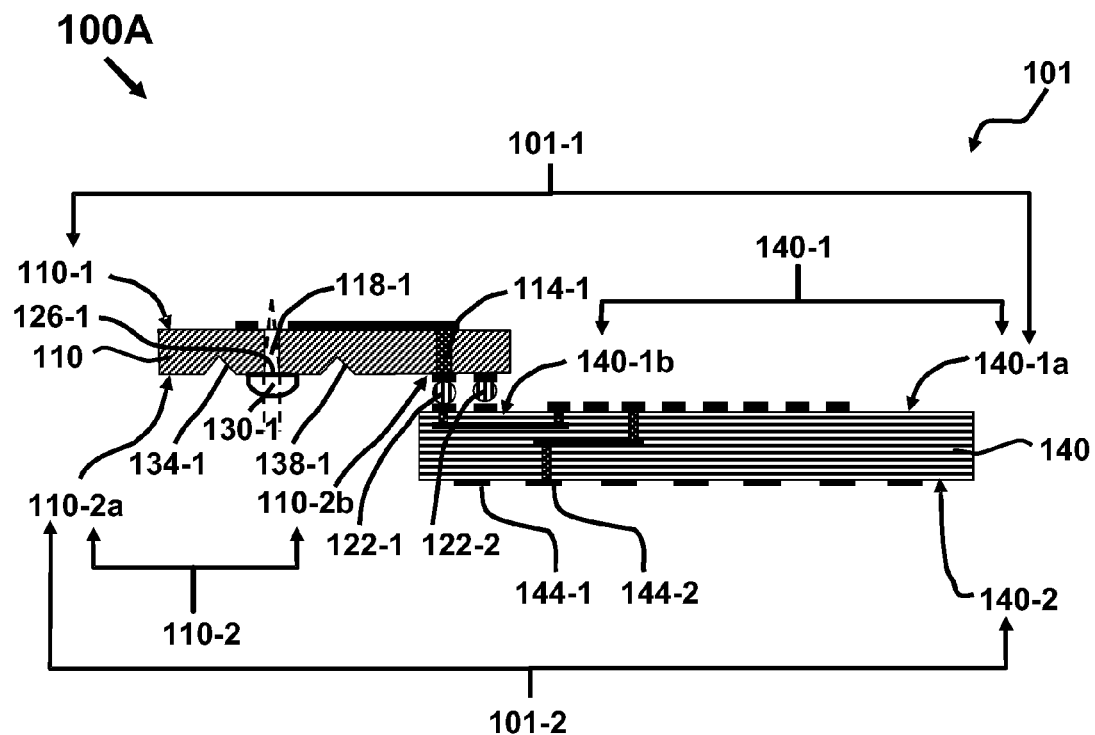
FIG. 1A is a cross-sectional view of one example of a hybrid electro-optical package for an opto-electronic engine, in accordance with examples of the present technology.

The drawings referred to in this description should not be understood as being drawn to scale except if specifically noted.

DESCRIPTION OF EXAMPLES

Reference will now be made in detail to the alternative examples of the present technology. While the technology will be described in conjunction with the alternative examples, it will be understood that they are not intended to limit the technology to these examples. On the contrary, the technology is intended to cover alternatives, modifications and equivalents, which may be included within the spirit and scope of the technology as defined by the appended claims.

Furthermore, in the following description of examples of the present technology, numerous specific details are set forth in order to provide a thorough understanding of the present technology. However, it should be noted that examples of the present technology may be practiced without these specific details. In other instances, well known methods, procedures, and components have not been described in detail as not to unnecessarily obscure examples of the present technology. Throughout the drawings, like components are denoted by like reference numerals, and repetitive descriptions are omitted for clarity of explanation if not necessary. As used herein, the articles, "a" and "an," will be understood as including the plural referents. Also, as used herein, the article, "the," and "said" will be understood as including the plural referents. In addition, as used herein, the term of art, "at least one," will be understood as including the plural referents.

Examples of the present technology include a hybrid electro-optical package for an opto-electronic engine. The hybrid electro-optical package includes a carrier substrate, a plurality of intra-package electrical interconnects and, and a package base. The carrier substrate includes a plurality of electrical vias and an optical via. The plurality of electrical vias and the optical via communicate between a back side and a front side of the carrier substrate. An intra-package electrical interconnect of the plurality of intra-package electrical interconnects is coupled to a respective electrical via of the carrier substrate. The package base is coupled to the carrier substrate by the plurality of intra-package electrical interconnects. The carrier substrate is to interconnect electrically with an opto-electronic component mounted on the back side of the carrier substrate, and includes an optical aperture at the front side of the carrier substrate for communication of optical signals through the optical via to, or from, the opto-electronic component, which may include, by way of example, a laser, a photodetector, or light-emitting diode, without limitation thereto. The package base is to provide for communication of electrical signals to, or from, an integrated circuit, and the opto-electronic component, which is disposed at a back side of the hybrid electro-optical package, transmitted through a plurality of lands and disposed at a front side of the package base. Examples of the present technology also include the opto-electronic engine that includes an array of opto-electronic components, the integrated circuit, and the hybrid electro-optical package. Thus, subsequently described examples of the present technology for the hybrid electro-optical package may also be understood as being incorporated within the opto-electronic engine.

Moreover, examples of the present technology also include an opto-electronic engine including the hybrid electro-optical package that includes a plurality of opto-electronic components configured as optical output transmitters for bit-lines of an optical bus, or alternatively, optical input receivers on bit-lines of the optical bus. Other examples of the present technology include a system including at least one optical bus and at least one opto-electronic engine including the hybrid electro-optical package. Further examples of the present technology include a system including a digital-information processor that includes at least one optical bus and at least one opto-electronic engine including the hybrid electro-optical package to transfer information between one component and another component coupled to the optical bus in the digital-information processor. Similarly, yet other examples of the present technology include a system including a data-processing center that includes at least one optical bus and at least one opto-electronic engine including the hybrid electro-optical package to transfer information between one digital-information processor and at least one other digital-information processor coupled to the optical bus in the data-processing center. Thus, subsequently described examples of the present technology for the opto-electronic engine, which includes the hybrid electro-optical package, as well as for the hybrid electro-optical package, itself, may also be understood as being incorporated within the following environments: the system including at least one optical bus and at least one opto-electronic engine, the digital-information processor, and the data-processing center.

Examples of the present technology include a hybrid electro-optical package that provides for interconnection of opto-electronic components of an opto-electronic engine, which in one example of the present technology may be incorporated into a system, by way of example without limitation thereto, including servers, routers, and switches. High speed electronic components such as processors and network switches are limited in their maximum performance by the bandwidth available on and off a package. Optical interconnects to the package can be used to increase the available bandwidth, however large numbers of optical waveguide connections, as in an optical bus, to the package are hard to manage and impede cooling airflow. By taking the optical connection from the underside of the package, the management of optical connections is greatly simplified. Thus, examples of the present technology provide a packaging arrangement for electro-optical multi-chip modules (MCMs), also referred to herein as opto-electronic engines. This packaging arrangement, also referred to herein as the hybrid electro-optical package, takes all its connections, both optical and electrical from the lower side, also referred to herein as the front side, of the hybrid electro-optical package, facilitating better cooling of, and more easily managed optical interconnection with, the opto-electronic engine.

Figure 2A:
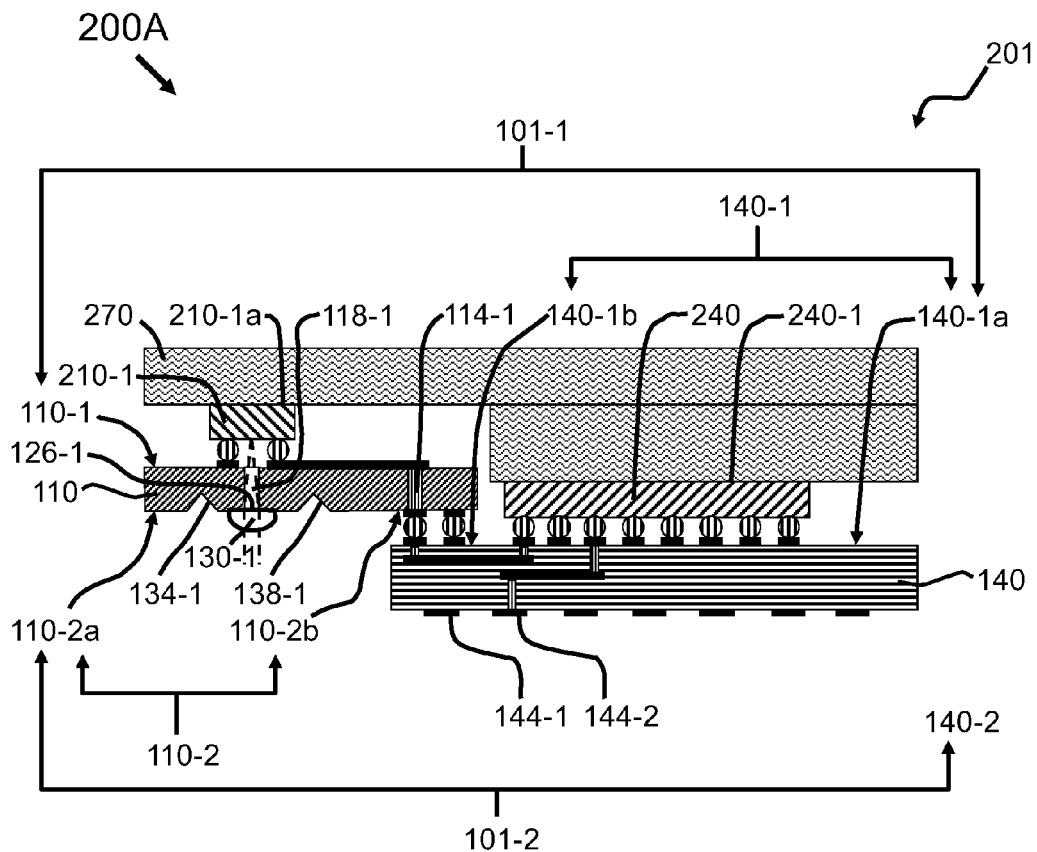
FIG. 2A is a cross-sectional view of one example of an opto-electronic engine for the example hybrid electro-optical package of FIG. 1A, in accordance with examples of the present technology.

With reference now to FIGS. 1A and 2A, in accordance with examples of the present technology, a cross-sectional view 100A is shown in FIG. 1A of one example of a hybrid electro-optical package 101 for an opto-electronic engine 201; and, in FIG. 2A, a cross-sectional view 200A is shown of one example of the opto-electronic engine 201 for the example hybrid electro-optical package 101 of FIG. 1A. The hybrid electro-optical package 101 includes a carrier substrate 110, a plurality of intra-package electrical interconnects, for example, intra-package electrical interconnects 122-1 and 122-2, and a package base 140. By way of example, the carrier substrate 110 may include a silicon substrate, without limitation thereto. The carrier substrate 110 includes a plurality of electrical vias, for example, electrical via 114-1, and an optical via 118-1. The plurality of electrical vias, for example, electrical via 114-1, and the optical via 118-1 communicate between the back side 110-1 and the front side 110-2 of the carrier substrate 110. An intra-package electrical interconnect, for example, intra-package electrical interconnect 122-1, of the plurality of intra-package electrical interconnects, for example, intra-package electrical interconnects 122-1 and 122-2, is coupled to a respective electrical via, for example, electrical via 114-1, of the carrier substrate 110. The package base 140 is coupled to the carrier substrate 110 by the plurality of intra-package electrical interconnects, for example, intra-package electrical interconnects 122-1 and 122-2.

The carrier substrate 110 is to interconnect electrically with an opto-electronic component 210-1 mounted on the back side 110-1 of the carrier substrate 110, and includes an optical aperture 126-1 at the front side 110-2 of the carrier substrate 110 for communication of optical signals through the optical via 118-1 to, or from, the opto-electronic component 210-1. By way of example, the opto-electronic component 210-1 may be selected from the group consisting of an optical transmitter, such as a vertical-cavity, surface-emitting laser (VCSEL), and an optical receiver, such as a photodiode, without limitation thereto. The package base 140 is to provide for communication of electrical signals to, or from, an integrated circuit 240 and the opto-electronic component 210-1 disposed at a back side 101-1 of the hybrid electro-optical package 101 transmitted through a plurality of lands, of which lands 144-1 and 144-2 are examples, disposed at a front side 140-2 of the package base 140.

Figure 1B:
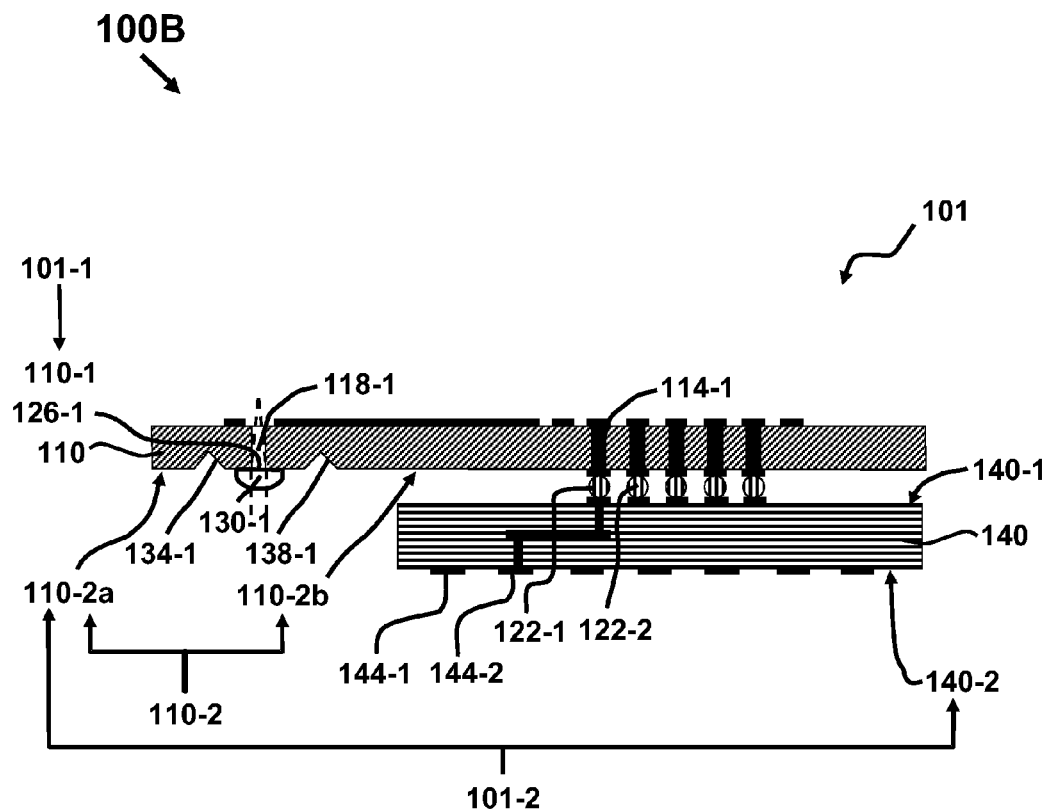
FIG. 1B is a cross-sectional view of another example of a hybrid electro-optical package for an opto-electronic engine, in accordance with examples of the present technology.
Figure 2B:
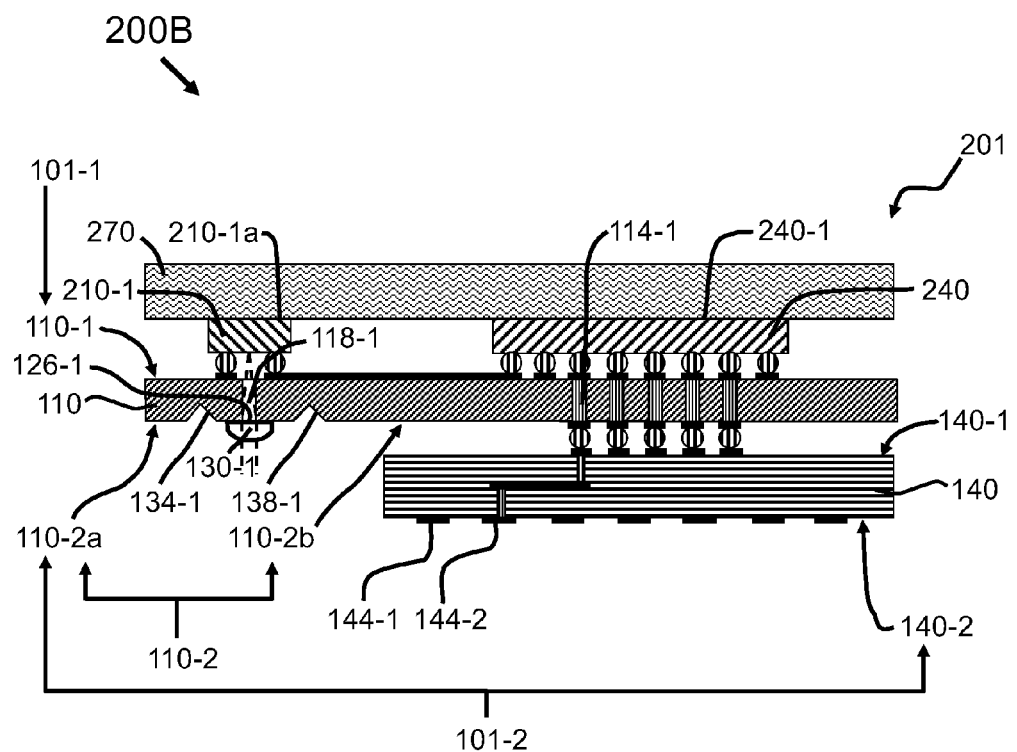
FIG. 2B is a cross-sectional view of another example of an opto-electronic engine for the other example hybrid electro-optical package of FIG. 1B, in accordance with examples of the present technology.

With reference now to FIGS. 1B and 2B, and further reference to FIGS. 1A and 2A, in accordance with examples of the present technology, a cross-sectional view 100B is shown in FIG. 1B of an another example of the hybrid electro-optical package 101 for the opto-electronic engine 201; and, in FIG. 2B, a cross-sectional view 200B is shown of an another example of the opto-electronic engine 201 for the example hybrid electro-optical package 101 of FIG. 1B. The hybrid electro-optical package 101 of FIG. 1A may be distinguished from the hybrid electro-optical package 101 of FIG. 1B in the manner in which the back side 101-1 of the hybrid electro-optical package 101 is configured. As shown in FIG. 1A, the back side 140-1 of the package base 140 includes a first portion 140-1a of the back side 140-1 of the package base 140 not overlapped by the carrier substrate 110 and a second portion 140-1b of the back side 140-1 of the package base 140 overlapped by the carrier substrate 110. Thus, for the example of the present technology shown in FIG. 1A, the back side 101-1 of the hybrid electro-optical package 101 includes the back side 110-1 of the carrier substrate 110 and the first portion 140-1a of the back side 140-1 of the package base 140. In contrast, for the other example of the present technology shown in FIG. 1B, the back side 101-1 of the hybrid electro-optical package 101 includes just the back side 110-1 of the carrier substrate 110.

The alternate configurations of FIGS. 1A and 1B allow for different locations for the mounting of the integrated circuit 240. For the example of the present technology shown in FIG.

2A, the integrated circuit 240 is mounted on the first portion 140-1a of the back side 140-1 of the package base 140 not overlapped by the carrier substrate 110. In contrast, for the other example of the present technology shown in FIG. 2B, the integrated circuit 240 is mounted on back side 110-1 of the carrier substrate 110 along with the opto-electronic component 210-1. The latter arrangement of FIG. 2B provides better signal integrity for communication between the integrated circuit 240 and the opto-electronic component 210-1, but at the price of higher cost in fabrication of the opto-electronic engine 201. The former arrangement of FIG. 2A provides lower cost in fabrication of the opto-electronic engine 201, but at the price of poorer signal integrity for communication between the integrated circuit 240 and the opto-electronic component 210-1. Depending on the application, the designer may prefer one or the other arrangement by making appropriate trade-offs between signal quality and cost of fabrication.

With further reference to FIGS. 1B and 2B, and further reference to FIGS. 1A and 2A, in accordance with examples of the present technology, the front side 101-2 of the hybrid electro-optical package 101 is configured essentially the same for both arrangements shown in FIGS. 1A and 1B. As shown in both FIGS. 1A and 1B, the front side 110-2 of the carrier substrate 110 includes a first portion 110-2a of the front side 120-2 of the carrier substrate 110 not overlapping the package base 140 and a second portion 110-2b of the front side 110-2 of the carrier substrate 110 overlapping the package base 140. Thus, for both examples of the present technology shown, respectively, in FIGS. 1A and 1B, the front side 101-2 of the hybrid electro-optical package 101 includes the first portion 110-2a of the front side 110-2 of the carrier substrate 110 and the front side 140-2 of the package base 140. Nevertheless, the different arrangements of the plurality of intra-package electrical interconnects, for example, intra-package electrical interconnects 122-1 and 122-2, between the second portion 110-2b of the front side 110-2 of the carrier substrate 110 and the back side 140-1 of the package base 140 produce differences in the routing of electrical signals between the integrated circuit 240 and the opto-electronic component 210-1. Thus, in latter arrangement of FIG. 2B, electrical signals travel directly in the carrier substrate 110 between the integrated circuit 240 and the opto-electronic component 210-1. Whereas, in former arrangement of FIG. 2A, electrical signals between the integrated circuit 240 and the opto-electronic component 210-1 travel indirectly through the package base 140 before reaching the carrier substrate 110 on which the opto-electronic component is mounted, which may cause differences in signal quality between the two arrangements as previously described.

Therefore, with further reference to FIGS. 1A-2B, in accordance with examples of the present technology, the following may be noted. For the example of the present technology shown in FIGS. 1B and 2B, the carrier substrate 110 is to interconnect electrically the integrated circuit 240 with the opto-electronic component 210-1. However, for the other example of the present technology shown in FIGS. 1A and 2A, the package base 140 is to interconnect electrically with the integrated circuit 240 mounted on the back side 140-1 of the package base 140. Consequently, the package base 140 is to interconnect electrically the integrated circuit 240 with the opto-electronic component 210-1 through the carrier substrate 110, on which the opto-electronic component 210-1 is mounted. In addition, the package base 140 is to interconnect electrically with a printed-circuit board (PCB) 401 (see FIGS. 3A and 3B) on the front side 140-2 of the package base 140 through a land grid array (LGA) connector 320.

With further reference to FIGS. 1A-2B, in accordance with examples of the present technology, the package base 140 may include a FR4 interposer, where the term of art, "FR4," refers to a flame retardant grade of laminated fiberglass epoxy composite used in PCBs. In accordance with examples of the present technology, FR-4 is included as a reference to a generic class of suitable dielectric materials, rather than a specific material. It will be understood that other dielectric materials, for example Megtron 6 or Nelco 4000-13, can be substituted for FR-4 within the spirit and scope of examples of the present technology. The plurality of intra-package electrical interconnects, for example, intra-package electrical interconnects 122-1 and 122-2, includes a plurality of solder balls. The plurality of solder balls may be arranged in a ball grid array (BGA). During the fabrication process of the opto-electronic engine 201, in one example of the present technology, solder balls of the plurality of intra-package electrical interconnects, for example, intra-package electrical interconnects 122-1 and 122-2, disposed on the package base 140 may be brought into contact with a plurality of lands of the plurality of electrical vias, of which electrical via 114-1 is an example, which are disposed at the front side 110-2 of the carrier substrate 110. Upon applying heat in a solder reflow process, the solder balls of the plurality of intra-package electrical interconnects, for example, intra-package electrical interconnects 122-1 and 122-2, form solder joints with the plurality of lands of the plurality of electrical vias, of which electrical via 114-1 is an example. Moreover, in accordance with examples of the present technology, the carrier substrate 110 includes an alignment structure 134-1 and 138-1, to self-align vertically and laterally the opto-electronic component 210-1 relative to an optical-waveguide ferrule 340-1 (see FIGS. 3A and 3B).

With reference once again to FIG. 2A and further reference to FIG. 1A, in accordance with examples of the present technology, the cross-sectional view 200A shows that opto-electronic engine 201 for the example hybrid electro-optical package 101 of FIG. 1A includes an array 210 (see FIG. 5A) of opto-electronic components, of which opto-electronic component 210-1 is an example, the integrated circuit 240, and the hybrid electro-optical package 101. The hybrid electro-optical package 101 includes the carrier substrate 110, the plurality of intra-package electrical interconnects, for example, intra-package electrical interconnects 122-1 and 122-2, and the package base 140. The carrier substrate 110 includes the plurality of electrical vias, of which electrical via 114-1 is an example, and a plurality of optical vias, of which optical via 118-1 is an example. The plurality of electrical vias, of which electrical via 114-1 is an example, and the plurality of optical vias, of which optical via 118-1 is an example, communicate between the back side 110-1 and the front side 110-2 of the carrier substrate 110. The intra-package electrical interconnect 122-1 is coupled electrically to a respective electrical via 114-1 of the carrier substrate 110. The package base 140 is coupled electrically to the carrier substrate 110 by the plurality of intra-package electrical interconnects, for example, intra-package electrical interconnects 122-1 and 122-2. The carrier substrate 110 is interconnected electrically with the array 210 of opto-electronic components, of which opto-electronic component 210-1 is an example, mounted on the back side 110-1 of the carrier substrate 110.

The carrier substrate 110 also includes a plurality of optical apertures, of which optical aperture 126-1 is an example, at the front side 110-2 of the carrier substrate 110 for communication of optical signals through the plurality of optical vias, of which optical via 118-1 is an example, to the array 210 of opto-electronic components, of which opto-electronic component 210-1 is an example. The package base 140 is to provide for communication of electrical signals to the integrated circuit 240 and the array 210 of opto-electronic components, of which opto-electronic component 210-1 is an example, which are disposed at the back side 101-1 of the hybrid electro-optical package 101 transmitted through a plurality of lands, of which lands 144-1 and 144-2 are examples, disposed at the front side 140-2 of the package base 140.

With reference once again to FIG. 2B and further reference to FIG. 1B, in accordance with examples of the present technology, the cross-sectional view 200B shows that the opto-electronic engine 201 for the other example hybrid electro-optical package 101 of FIG. 1B includes the array 210 (see FIG. 5A) of opto-electronic components, of which opto-electronic component 210-1 is an example, the integrated circuit 240, and the hybrid electro-optical package 101. The other example opto-electronic engine 201 shown in FIG. 2B is configured similar to the example opto-electronic engine 201 shown in FIG. 2A. However, in the other example of the present technology shown in FIG. 2B, the package base 140 is to provide for communication of electrical signals to the integrated circuit 240 and the array 210 of opto-electronic components, of which opto-electronic component 210-1 is an example, which are disposed at the back side 110-1 of the carrier substrate 110 transmitted through a plurality of lands, of which lands 144-1 and 144-2 are examples, disposed at the front side 140-2 of the package base 140. Thus, for the other example of the present technology shown in FIG. 2B, the carrier substrate 110 is interconnected electrically with the integrated circuit 240 mounted on the back side 110-1 of the carrier substrate 110.

With further reference to both FIGS. 2A and 2B, in accordance with examples of the present technology, an opto-electronic component, of which opto-electronic component 210-1 is an example, of the array 210 of opto-electronic components may be selected from the group consisting of an optical transmitter, such as a vertical-cavity, surface-emitting laser (VCSEL), and an optical receiver, such as a photo-diode. The opto-electronic engine 201 may also include a heat spreader 270 that is coupled to a back side of an opto-electronic component, of which back side 210-1a of opto-electronic component 210-1 is an example, of the array 210 of opto-electronic components and a back side 240-1 of the integrated circuit 240. The heat spreader 270 is to dissipate heat generated by the array 210 of opto-electronic components, of which opto-electronic component 210-1 is an example, and the integrated circuit 240, when the opto-electronic component, of which opto-electronic component 210-1 is an example, and the integrated circuit 240 are electrically powered. In one example of the present technology, the integrated circuit 240 may include an application-specific integrated circuit (ASIC). The opto-electronic engine 201 may also include an array of electrical lands, of which lands 144-1 and 144-2 are examples, disposed at the front side 140-2 of the package base 140. The plurality of optical apertures, of which optical aperture 126-1 is an example, at the front side 110-2 of the carrier substrate 110 is to couple with an optical connector 340. The array of electrical lands, of which lands 144-1 and 144-2 are examples, is to couple with LGA connector 320 of a package interposer 301 mounted on PCB 401, which are next described in greater detail.

Figure 3A:
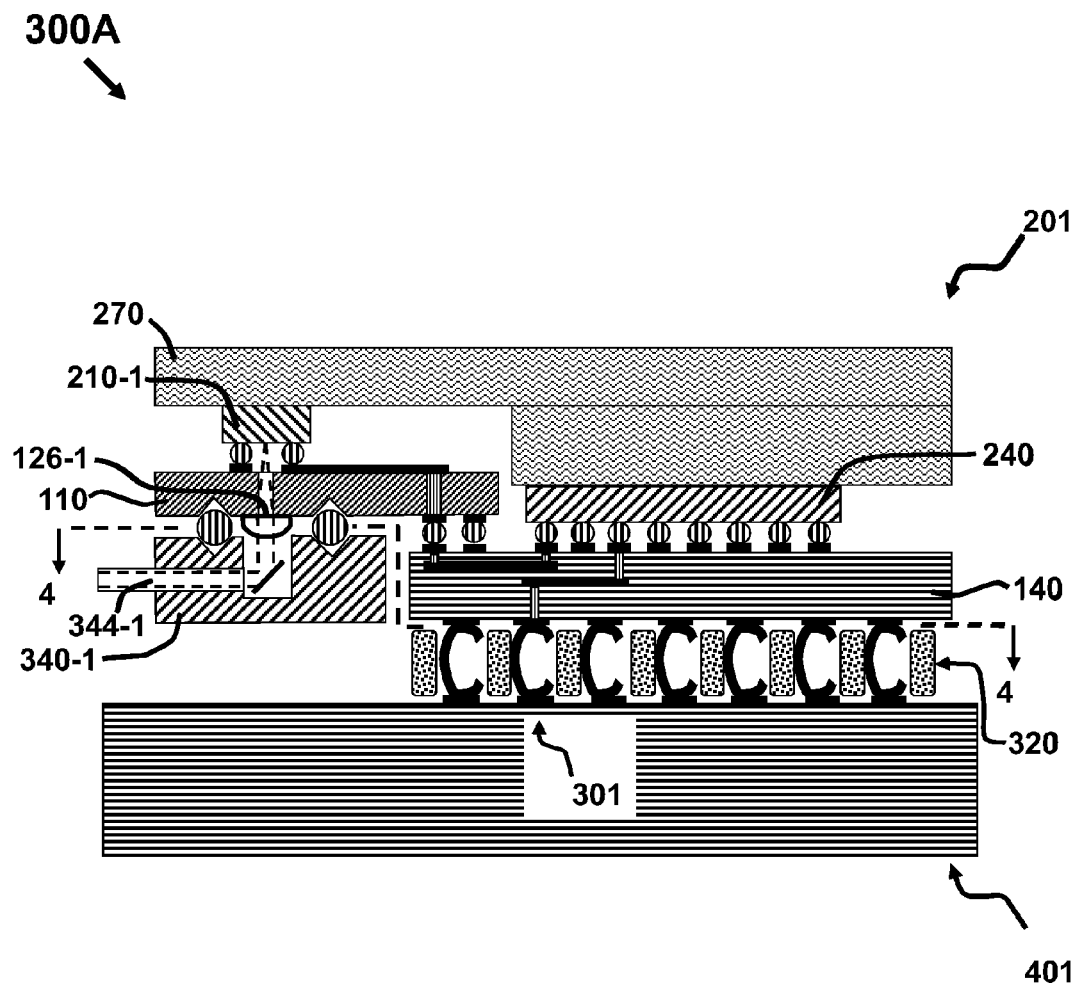
FIG. 3A is a cross-sectional view of one example of a package interposer interconnecting the example opto-electronic engine of FIG. 2A with a printed-circuit board (PCB), in accordance with examples of the present technology.

With reference now to FIG. 3A and further reference to FIGS. 1A and 2A, in accordance with examples of the present technology, a cross-sectional view 300A is shown of one example package interposer 301 interconnecting the example opto-electronic engine 201 of FIG. 2A with the PCB 401. Line 4-4 shows the trace of the front side 101-2 of the hybrid electro-optical package 101 and a section through the drawing of FIG. 3A separating component parts of the package interposer 301 from component parts of the opto-electronic engine 201. As shown in FIG. 3A, the example package interposer 301 includes the LGA connector 320, the optical-waveguide ferrule 340-1, which may be an optical-waveguide ferrule of the optical connector 340 (see FIG. 4), and an optical waveguide 344-1, which may be an optical waveguide of a plurality including a bit-line 550-1 of an optical bus 550 of a system 501, subsequently described in the discussion of FIG. 5A. As shown in FIG. 3A, by way of example, rather than using a silicon substrate that spans the entire package, as next described in the discussion of FIG. 3B, smaller silicon substrates may be used, for example, for carrier substrate 110, which are disposed around the periphery of the LGA connector 320. This reduces the cost of the silicon substrate, at the expense of a slightly longer and more complex electronic signal path between the integrated circuit 240, by way of example, an ASIC, and the optical devices, by way of example, opto-electronic components such as VCSELs and photo-diodes, without limitation thereto, of which opto-electronic component 210-1 is an example.

Figure 3B:
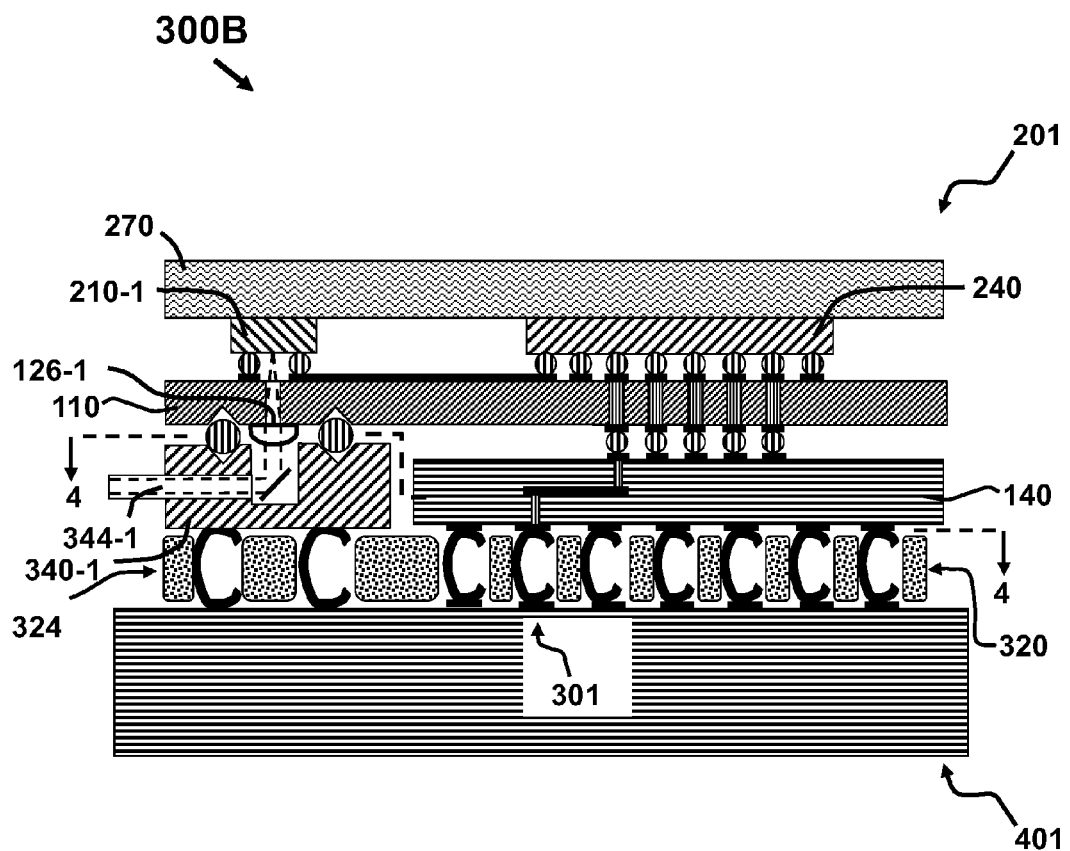
FIG. 3B is a cross-sectional view of another example of a package interposer interconnecting the other example opto-electronic engine of FIG. 2B with the PCB, in accordance with examples of the present technology.

With reference now to FIG. 3B and further reference to FIGS. 1B and 2B, in accordance with examples of the present technology, a cross-sectional view 300B is shown of the other example of the package interposer 301 interconnecting the other example opto-electronic engine 201 of FIG. 2B with the PCB 401. Line 4-4 shows the trace of the front side 101-2 of the hybrid electro-optical package 101 and a section through the drawing of FIG. 3B separating component parts of the package interposer 301 from component parts of the opto-electronic engine 201. As shown in FIG. 3B, similar to FIG. 3A, the example package interposer 301 includes the LGA connector 320, the optical-waveguide ferrule 340-1, which may be one optical-waveguide ferrules of a plurality of the optical connector 340 (see FIG. 4), and the optical waveguide 344-1, which may be one optical waveguide of a plurality including a bit-line 550-1 of an optical bus 550 of a system 501, subsequently described in the discussion of FIG. 5A. However, the example package interposer 301 of FIG. 3B also includes a spring-loaded retainer 324 for retaining the optical-waveguide ferrule 340-1 in place.

The optical connector 340 (see FIG. 4) including, for example, the plurality of optical-waveguide ferrules, of which optical-waveguide ferrule 340-1 is an example, are held in approximate alignment by the LGA connector 320 of the package interposer 301, which acts as a socket body to accept the package base 140, while the optical connector 340 may be disengaged from the front side 110-2 of the carrier substrate 110. The alignment structure 134-1 and 138-1, to self-align vertically and laterally the opto-electronic component 210-1 relative to the optical-waveguide ferrule 340-1 on the front side 110-2 of the carrier substrate 110, includes pits of the "ball-and-pit" arrangement shown, and provides accurate alignment of the carrier substrate 110 with respect to the optical connector 340 including the optical-waveguide ferrule 340-1. As shown in FIG. 3B, in one example of the present technology, all the active components, for example, opto-electronic components, similar to opto-electronic component 210-1, and integrated circuits, similar to integrated circuit 240, are disposed on the back side 110-1 of the carrier substrate 110. In one example of the present technology, the carrier substrate 110 is patterned with multiple levels of interconnects, which connect these active components.

With further reference to FIGS. 3A and 3B, as well as to FIGS. 1A-2B, in accordance with examples of the present technology, an appropriate carrier substrate 110 for high speed MCMs, such as the opto-electronic engine 201, includes a silicon substrate. Electrical signals to, and from, the opto-electronic engine 201 may pass through the carrier substrate 110 by means of through silicon vias (TSVs), for example, electrical via 114-1. Optical signals may pass through the carrier substrate 110 by means of through-holes in the carrier substrate 110, for example, optical via 118-1. In one example of the present technology, the optical via may be a tapered hole, for example, as described in PCT Patent Application, Serial Number PCT/US2011/020785 by Michael Renne Ty Tan, et al., filed on Jan. 11, 2011, entitled "PASSIVE OPTICAL ALIGNMENT." The egress of the optical via 118-1 may be covered with a lens 130-1 to insure a beam exiting the assembly of the opto-electronic engine 201 has low divergence. The carrier substrate 110 may be attached to the package base 140, to distribute the chip connections to a wider pitch for connection to the LGA connector 320. In an example of the present technology, connection areas may be formed on the front side 140-2 of the package base 140 of the hybrid electro-optical package 101 to connect to the package interposer 301 that provides a hybrid electro-optical socket for the hybrid electro-optical package 101.

With further reference to FIGS. 3A and 3B, as well as to FIGS. 1A-2B, the carrier substrate 110 is to interconnect optically with the optical-waveguide ferrule 340-1 on the front side 110-2 of the carrier substrate 110 for communication of optical signals with the optical waveguide 344-1 coupled to the optical-waveguide ferrule 340-1. By way of example, as shown in FIGS. 3A and 3B, the optical waveguide 344-1 may be an optical fiber, and the optical-waveguide ferrule 340-1 may be an optical-fiber ferrule, without limitation thereto, as other types of optical waveguides, such as hollow-metal waveguides (HMWGs) are also within the spirit and scope of examples of the present technology. The hybrid electro-optical package 101 may also include the lens 130-1 disposed at the optical aperture 126-1 of the optical via 118-1. The lens 130-1 couples light passing through the optical-waveguide ferrule 340-1 with an entrance pupil of the opto-electronic component 210-1. Thus, the lens 130-1 may focus light from the optical waveguide 344-1 passing through the optical-waveguide ferrule 340-1 onto the opto-electronic component 210-1. Alternatively, the lens 130-1 may diverge light from the opto-electronic component 210-1 onto an entrance pupil of the optical-waveguide ferrule 340-1 to couple with the optical waveguide 344-1.

Figure 4:
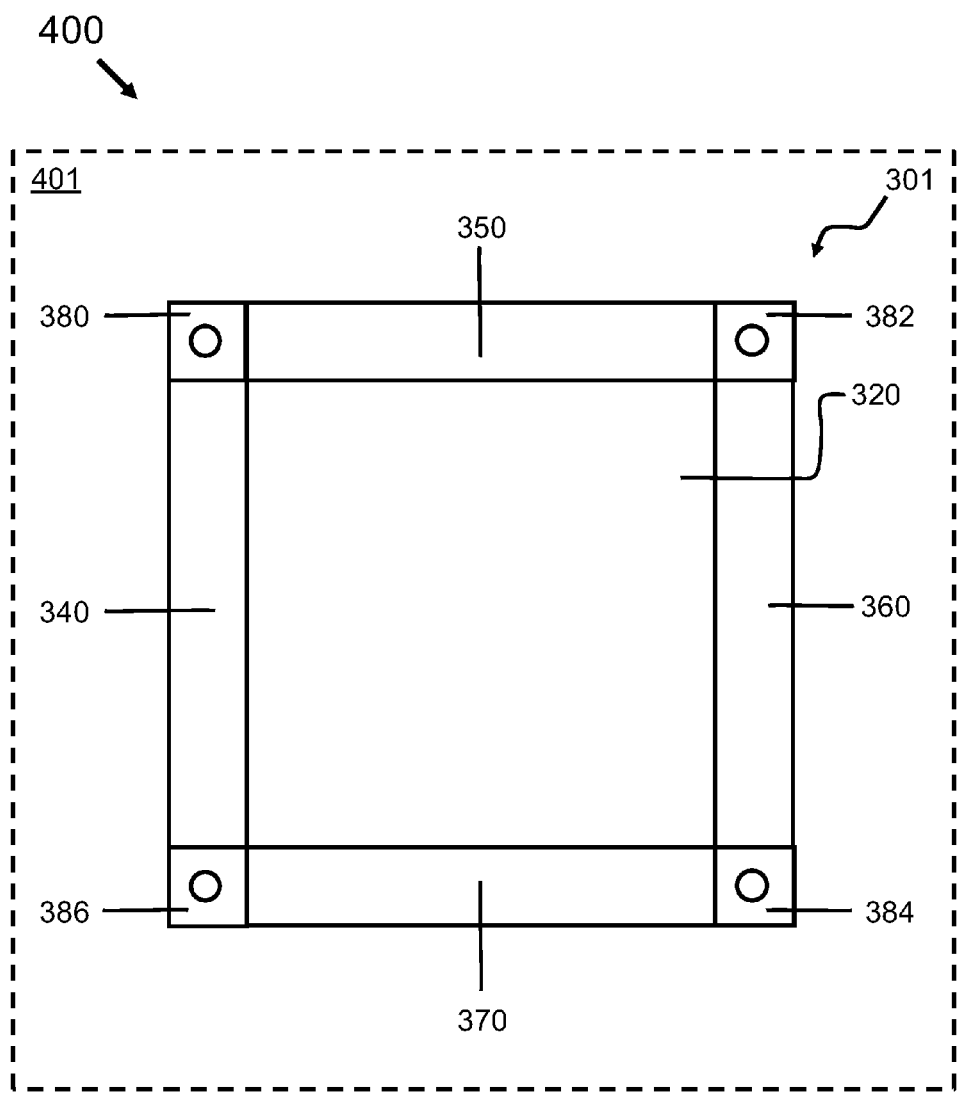
FIG. 4 is a plan view of the package interposer for interconnecting an opto-electronic engine with the PCB, in accordance with examples of the present technology.

With reference now to FIG. 4 and further reference to FIGS. 1A-3B, in accordance with examples of the present technology, a plan view 400 is shown of the package interposer 301 for interconnecting the opto-electronic engine 201 with the PCB 401. Plan view 400 of FIG. 4 shows component parts of the package interposer 301 below the section corresponding to the line 4-4 of the trace of the front side 101-2 of the hybrid electro-optical package 101 shown in FIGS. 3A and 3B. As shown in FIG. 4, by way of example without limitation thereto, the package interposer 301 includes the LGA connector 320, four optical connectors 340, 350, 360, and 370 including pluralities of optical-waveguide ferrules, similar to the optical-waveguide ferrule 340-1, and four fastening flanges 380, 382, 384 and 386 with through holes to accept fasteners (not shown) that are disposed at the corner of the package interposer 301. Thus, in accordance with examples of the present technology, the center of the package interposer 301 is used as a standard LGA connector 320. The outer areas at the four edges of the interposer are available for the optical connectors 340, 350, 360 and 370. Also, the corner areas including the four fastening flanges 380, 382, 384 and 386 may be used for mechanical retention of the opto-electronic engine 201 including the hybrid electro-optical package 101.

However, a retaining force is required to hold the hybrid electro-optical package 101 in place. The retaining force may be applied by fastening the heat spreader 270 to the PCB 401 using fasteners, which pass through the four fastening flanges 380, 382, 384 and 386 disposed at the corners of the package interposer 301 and through the PCB 401. For example, the fasteners may be bolts that fasten the opto-electronic engine 201, including the hybrid electro-optical package 101, and the package interposer 301 to the PCB 401. Thus, in accordance with examples of the present technology, the complete assembly including the opto-electronic engine 201 along with the hybrid electro-optical package 101 and package interposer 301 connects to the PCB 401 via the package interposer 301. Portions of the package interposer 301 used for electrical interconnections, such as the LGA connector 320, are populated with spring type electrical connectors. Portions of the package interposer 301 used for optical connectors 340, 350, 360 and 370, such as the spring-loaded retainer 324, also provide a spring action to keep the optical connector, for example, optical connector 340, in contact with the carrier substrate 110 of the hybrid electro-optical package 101.

With further reference to FIG. 4 and FIGS. 1A-3B, in accordance with examples of the present technology, as previously described, the optical connector 340 may include a plurality of optical-fiber ferrules for respective optical fibers, such as the optical-waveguide ferrule 340-1 for the respective optical waveguide 344-1 shown in FIGS. 3A and 3B. Alternatively, the optical connector 340 may include a plurality of optical-fiber ferrules for respective flexible optical ribbon waveguides (not shown). In an another example (not shown) of the present technology, the optical connector 340 may be used for a hollow metal waveguide (HMWG) to connect to the front panel, or alternatively, the backplane, of the PCB 401, or to other optically enabled devices. Where HMWGs are employed, HMWG based circuit switches may be integrated to allow configuration of alternate optical paths. Also, in accordance with yet other examples of the present technology, the optical connector 340 may be interfaced to a plurality of optical waveguides providing bit-lines of an optical bus 550, which is next described in the discussion of FIG. 5A.

Figure 5A:
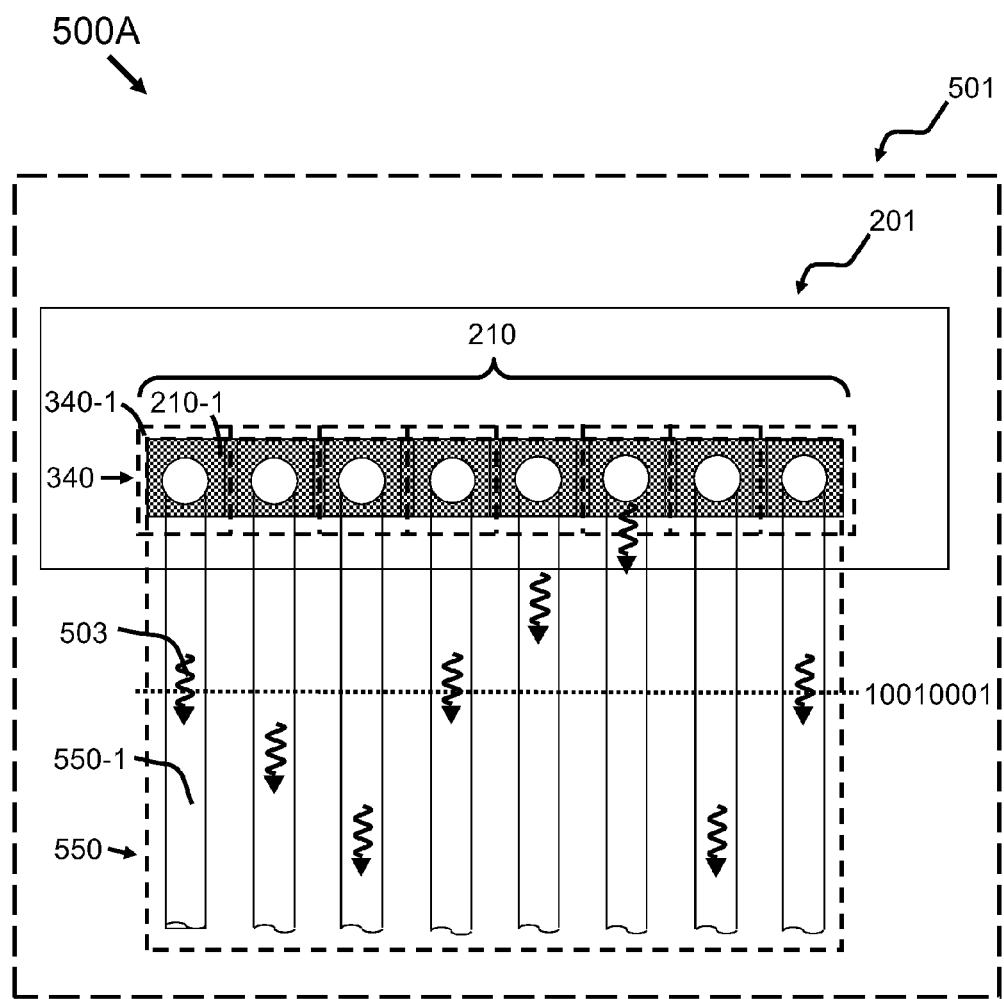
FIG. 5A is a schematic diagram of the opto-electronic engine, and an example system including at least one optical bus and at least one opto-electronic engine, in accordance with examples of the present technology.

With reference now to FIG. 5A and further reference to FIGS. 1A-4, in accordance with examples of the present technology, a schematic diagram 500A is shown of the opto-electronic engine 201 including the hybrid electro-optical package 101, which may include the array 210 of opto-electronic components, of which opto-electronic component 210-1 is an example. The plurality of the opto-electronic components may be disposed on the carrier substrate 110 of the hybrid electro-optical package 101. By way of example, as shown in FIG. 5A, in accordance with one example of the present technology, the array 210 of opto-electronic components may be one by eight, without limitation thereto. Alternatively, by way of another example (not shown) of the present technology, the array 210 of opto-electronic components may be one by twelve, without limitation thereto. Alternatively, in accordance with examples of the present technology, the array 210 of opto-electronic components may be more generally n by m, where n is the number of rows in the array, and m is the number of columns in the array.

Previously described examples of the present technology for the hybrid electro-optical package 101 of FIGS. 1A and 1B may be incorporated within the environment of the opto-electronic engine 201. By way of example, as shown in FIG. 5A, the opto-electronic engine 201 may be configured as an optical bus transmitter, as for the case in which the plurality of opto-electronic components is a plurality of VCSELs, without limitation thereto. In accordance with examples of the present technology, as shown in FIG. 5A, an opto-electronic component 210-1 of the opto-electronic engine 201 may be configured as an optical output transmitter for an optical waveguide 344-1, for example, an optical fiber, that serves as a bit-line, for example, bit-line 550-1, of an optical bus 550. Thus, in accordance with examples of the present technology, the opto-electronic engine 201 is interconnected with the optical bus 550 through the optical connector 340. Each bit-line in optical bus 550 is to receive light emitted from an opto-electronic component of the opto-electronic engine 201. For example, bit-line 550-1 is to receive light 503 emitted from opto-electronic component 210-1 of the array 210 of opto-electronic components disposed on the hybrid electro-optical package 101 included in the opto-electronic engine 201. As shown in FIG. 5A, the bit-lines in optical bus 550 may be to transmit a byte of information associated in positive logic with a bit corresponding to a pulse of light emitted from a selected opto-electronic component in opto-electronic engine 201. Alternatively, by way of another example (not shown), the opto-electronic engine 201 may be configured as an optical bus receiver, as for the case in which the array 210 of opto-electronic components is an array 210 of photo-diodes, without limitation thereto.

However, for the optical transmitter example of FIG. 5A, with further reference to FIGS. 1A-4, a pulse of light 503 emitted from opto-electronic component 210-1 corresponds to a first bit, a logical "1," of an eight-bit byte, given by bit-string "10010001," which corresponds to pulses of light emitted from selected opto-electronic components of the opto-electronic engine 201 including the hybrid electro-optical package 101 (as is indicated by the dotted line in FIG. 5A). As shown in FIG. 5A, by way of example, opto-electronic component 210-1 is the first opto-electronic component in the 1×8 array. Although examples of the present technology may be described herein using opto-electronic component 210-1, examples of the present technology apply, more generally, to opto-electronic components of an n×m array mounted on a carrier substrate, similar to carrier substrate 110, of an opto-electronic engine. Also, by way of example, FIG. 5A shows the optical bus 550 configured for the transmission of eight-bit bytes, without limitation thereto. However, optical buses including more or less optical waveguides than shown in FIG. 5A are also within the spirit and scope of examples of the present technology, for example, in the case of an optical bus including twelve optical waveguides. Moreover, by way of example, the optical bus 550 in FIG. 5A has been so far described as transmitting bytes in a parallel-bus configuration. However, in another example of the present technology, the optical bus 550 may also transmit bytes serially on each individual bit-line.

In FIG. 5A, in accordance with examples of the present technology, the schematic diagram 500A also shows an example system 501 including at least one optical bus 550 and at least one opto-electronic engine 201. However, examples of the present technology also include within their spirit and scope systems with other components integrated with optical buses and opto-electronic engines, similar to optical bus 550 and opto-electronic engine 201, which are next described.

Figure 5B:
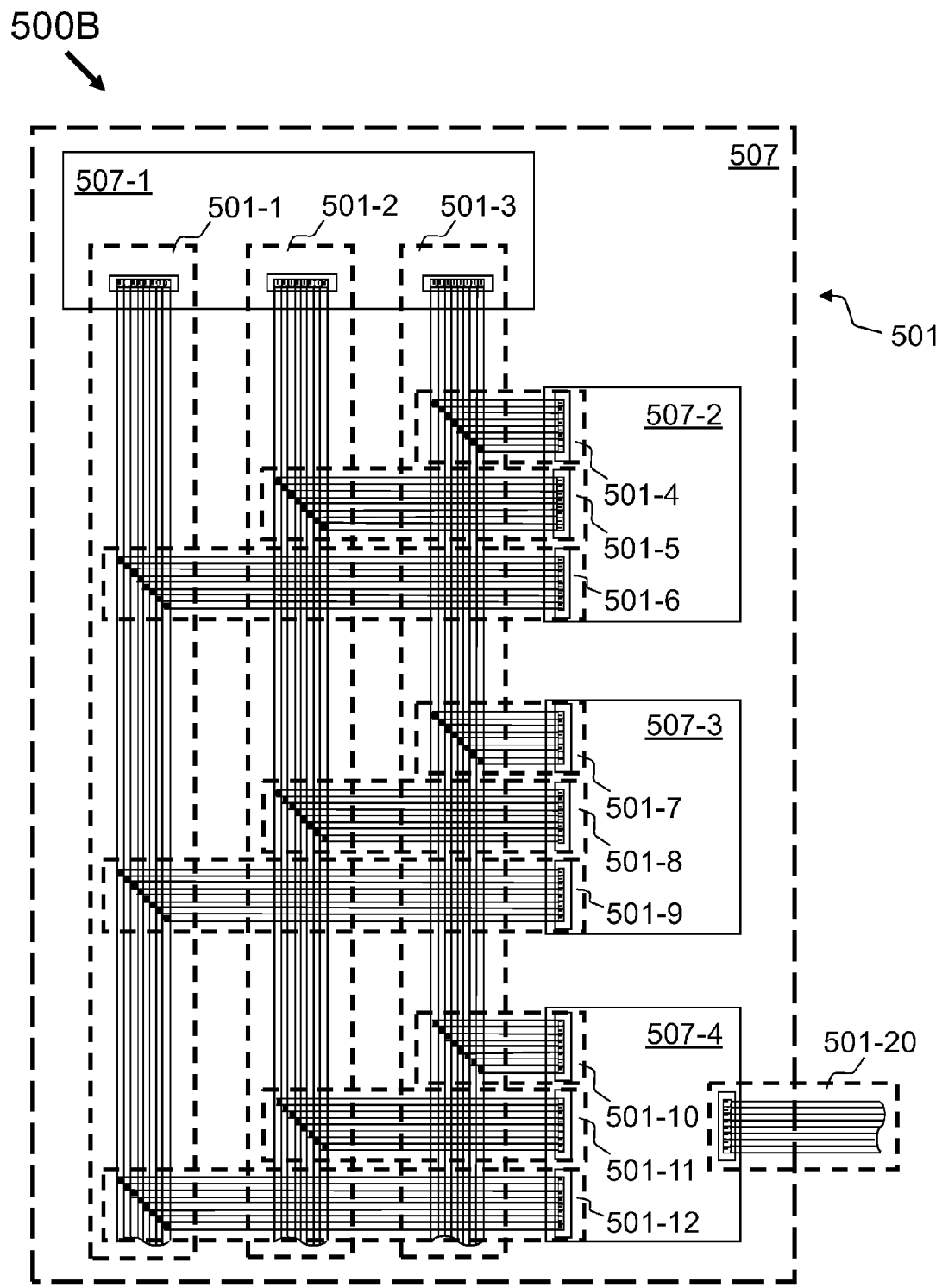
FIG. 5B is a schematic diagram of another example system, a digital-information processor, including at least one optical bus and at least one opto-electronic engine of FIG. 5A, in accordance with examples of the present technology.

With reference now to FIG. 5B and further reference to FIG. 5A, in accordance with examples of the present technology, a schematic diagram 500B is shown of yet another example system 501, which includes a digital-information processor 507, including at least one optical bus and at least one opto-electronic engine, for example, optical bus 550 and opto-electronic engine 201. In accordance with examples of the present technology, the system 501 may further include an integrated combination of components, viz., the digital-information processor 507. In accordance with examples of the present technology, the digital-information processor 507 includes a plurality of components 507-1, 507-2, 507-3 and 507-4 integrated with at least one optical bus and at least one opto-electronic engine, for example, opto-electronic engine 201. In accordance with examples of the present technology, at least one optical bus and at least one opto-electronic engine are to transfer information between one component and another component coupled to the optical bus in the digital-information processor 507. As used herein, a digital-information processor 507 includes an electronic apparatus that processes at least some information in digital form, for example, a computer, a server, a router, a switch, or a digital-electronic apparatus, without limitation thereto, such that the digital information is conveyed by at least one optical bus and at least one opto-electronic engine. For example, digital-information processor 507 may include a server including components 507-1, 507-2, 507-3 and 507-4 such that components 507-1, 507-2, 507-3 and 507-4 are: a central processing unit (CPU), a program memory, a data memory, and an input/output module, respectively.

With further reference to FIGS. 5A and 5B, in accordance with examples of the present technology, digital-information processor 507 is integrated with plurality of components 507-1, 507-2, 507-3 and 507-4 with a plurality of combined optical bus/opto-electronic engines 501-1, 501-2, 501-3, 501-4, 501-5, 501-6, 501-7, 501-8, 501-9, 501-10, 501-11 and 501-12, similar to the optical bus 550 and opto-electronic engine 201 of FIG. 5A. As shown in FIG. 5B, the respective combined optical bus/opto-electronic engines 501-1, 501-2 and 501-3 are coupled with components 507-2, 507-3 and 507-4 by respective combined optical bus/opto-electronic engines. For example, combined optical bus/opto-electronic engine 501-1 is coupled with components 507-2, 507-3 and 507-4 by respective combined optical bus/opto-electronic engines 501-6, 501-9 and 501-12. Similarly, combined optical bus/opto-electronic engine 501-2 is coupled with components 507-2, 507-3 and 507-4 by respective combined optical bus/opto-electronic engines 501-5, 501-8 and 501-11. Similarly, combined optical bus/opto-electronic engine 501-3 is coupled with components 507-2, 507-3 and 507-4 by respective combined optical bus/opto-electronic engines 501-4, 501-7 and 501-10. As shown in FIG. 5B, by way of example, the combined optical bus/opto-electronic engines may be configured as bi-directional devices such that an opto-electronic engine is disposed at either end of an optical bus, without limitation thereto.

Moreover, with further reference to FIGS. 5A and 5B, optical-bus receivers (not shown) may be interfaced to one or another end of an optical bus such that bi-directional and uni-directional optical buses are within the spirit and scope of examples of the present technology. By way of further example, in one example of the present technology, for the system 501 including a server as digital-information processor 507, the CPU, component 507-1, may be integrated with the program memory, the data memory, and the input/output module, respectively, components 507-2, 507-3 and 507-4, with a data bus, a control bus and an address bus. For one example of the present technology in which the system 501 includes the server, the data bus is included in respective combined optical bus/opto-electronic engines 501-1, 501-6, 501-9 and 501-12. Also, the control bus is included in respective combined optical bus/opto-electronic engines 501-2, 501-5, 501-8 and 501-11. Similarly, the address bus is included in respective combined optical bus/opto-electronic engines 501-3, 501-4, 501-7 and 501-10. As shown in FIG. 5B, in another example of the present technology, the digital-information processor 507 may include an input/output module, component 507-4, that is coupled with a combined optical bus/opto-electronic engine 501-20 that provides for the input and output of digital information to, and from, the digital-information processor 507, for example, a server, a router, or a switch, which is next described.

Figure 5C:
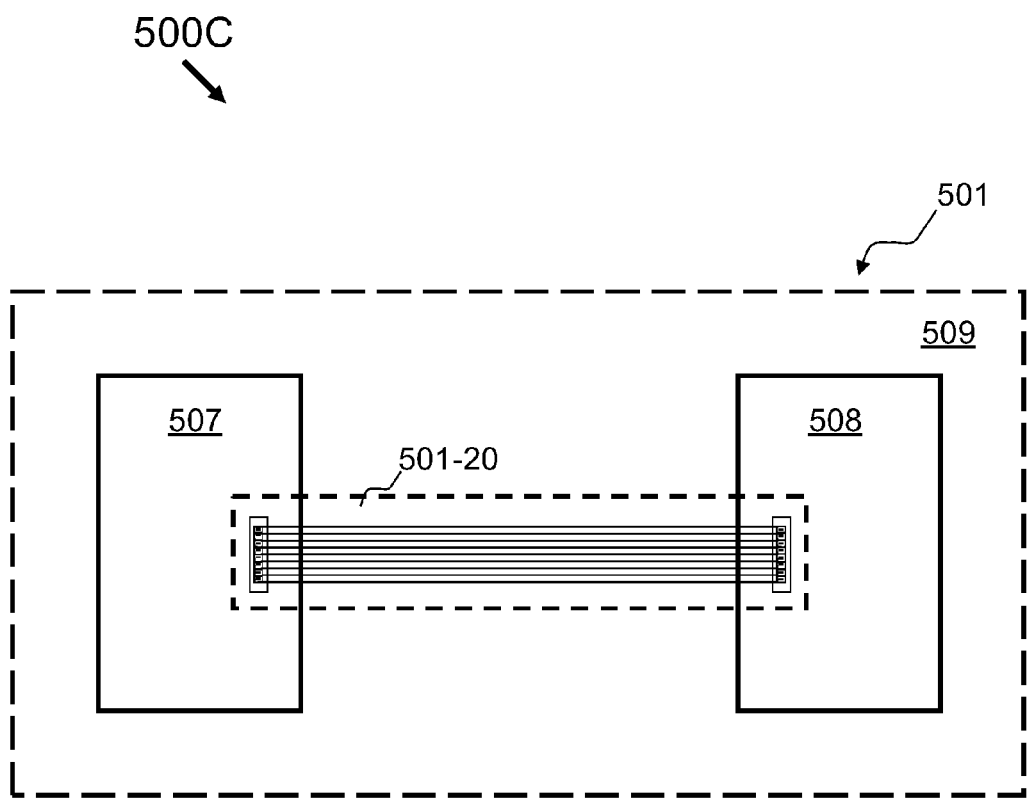
FIG. 5C is a schematic diagram of yet another example system, a data-processing center, including at least one optical bus and at least one opto-electronic engine of FIG. 5A, in accordance with examples of the present technology.

With reference now to FIG. 5C and further reference to FIGS. 5A and 5B, in accordance with examples of the present technology, a schematic diagram 500C is shown of yet another example system 501, a data-processing center 509 including at least one optical bus and at least one opto-electronic engine, for example, optical bus 550 and opto-electronic engine 201 of FIG. 5A. In accordance with examples of the present technology, the system 501 may further include an integrated combination of components, for example, a data-processing center 509. In accordance with examples of the present technology, the data-processing center 509 includes a plurality of digital-information processors, for example, digital-information processors 507 and 508, integrated with at least one optical bus and at least one opto-electronic engine, for example, combined optical bus/opto-electronic engine 501-20. In accordance with examples of the present technology, at least one optical bus and at least one opto-electronic engine are to transfer information between one digital-information processor 507 and another digital-information processor 508 coupled to the optical bus in the data-processing center 509. By way of example, in one example of the present technology, data-processing center 509 may include one server, router, or switch, including digital-information processor 507, and another server, router, or switch, including digital-information processor 508, without limitation thereto. However, examples of the present technology also include within their spirit and scope systems that include a plurality of servers, routers, switches, or combinations of servers, routers and switches integrated with combined optical bus/opto-electronic engines, of which combined optical bus/opto-electronic engine 501-20 is an example.

Opto-electronic engines and systems incorporating opto-electronic engines in accordance with examples of the present technology have increased off-package bandwidth due to the high bandwidth density of optical interconnects. Opto-electronic engines and systems incorporating opto-electronic engines in accordance with examples of the present technology would have lower power than equivalent all electronic assemblies, particularly when off package connections are greater than one meter (m). Moreover, opto-electronic engines and systems incorporating opto-electronic engines in accordance with examples of the present technology, as compared to a co-packaging solution where optical connections are made on the back side of the package provide the following. Firstly, the optical waveguides or waveguides may be held in place when the opto-electronic engine is removed. Secondly, the cooling of the active components, such as opto-electronic components and/or integrated circuits included in the opto-electronic engine, is enhanced, because airflow is not impeded by optical-fiber connections on the back side of the opto-electronic engine, and because all the active components, such as opto-electronic components and/or integrated circuits included in the opto-electronic engine, are directly connected to the heat spreader. Moreover, for opto-electronic engines and systems incorporating opto-electronic engines in accordance with examples of the present technology, as all connections are made in the Z-direction, which is the direction perpendicular to the plane of the carrier substrate and the package base of the hybrid electro-optical package, both optical and electrical connections are made simultaneously when the hybrid electro-optical package of the opto-electronic engine is inserted on top of the package interposer, which greatly simplifies the task of replacing the opto-electronic engine.

The foregoing descriptions of specific examples of the present technology have been presented for purposes of illustration and description. They are not intended to be exhaustive or to limit the technology to the precise forms disclosed, and many modifications and variations are possible in light of the above teaching. The examples described herein were chosen and described in order to best explain the principles of the technology and its practical application, to thereby enable others skilled in the art to best utilize the technology and various examples with various modifications as are suited to the particular use contemplated. It may be intended that the scope of the technology be defined by the claims appended hereto and their equivalents.

What is claimed is:

1. A hybrid electro-optical package for an opto-electronic engine, said package comprising:
    a carrier substrate, said carrier substrate including a plurality of electrical vias and an optical via, each of said plurality of electrical vias and said optical via providing a passage through said carrier substrate between a back side and a front side of said carrier substrate;
    a plurality of intra-package electrical interconnects, one of the intra-package electrical interconnects coupled to one of the electrical vias of said carrier substrate; and
    a package base, said package base coupled to said carrier substrate by said plurality of intra-package electrical interconnects,
    wherein a length of the carrier substrate overlaps an entire length of the package base,
    wherein said carrier substrate is to interconnect electrically with an opto-electronic component mounted on the back side of said carrier substrate, and includes an optical aperture at the front side of said carrier substrate for communication of optical signals through said optical via, and
    wherein said package base is to provide for communication of electrical signals to an integrated circuit and said opto-electronic component disposed at the back side of said hybrid electro-optical package transmitted through a plurality of lands disposed at a front side of said package base.

2. The hybrid electro-optical package of claim 1, wherein said carrier substrate is to interconnect electrically said integrated circuit with said opto-electronic component.

3. The hybrid electro-optical package of claim 1, wherein said package base is to interconnect electrically with the integrated circuit mounted on the back side of said package base.

4. The hybrid electro-optical package of claim 3, wherein said package base is to interconnect electrically said integrated circuit with said opto-electronic component mounted on said carrier substrate.

5. The hybrid electro-optical package of claim 1, wherein said carrier substrate comprises a silicon substrate.

6. The hybrid electro-optical package of claim 1, wherein said package base comprises a FR4 interposer.

7. The hybrid electro-optical package of claim 1, wherein said plurality of intra-package electrical interconnects comprises a plurality of solder balls.

8. The hybrid electro-optical package of claim 1, wherein said plurality of intra-package electrical interconnects comprises a plurality of solder balls in a ball grid array (BGA).

9. An opto-electronic engine, comprising:
an array of opto-electronic components;
an integrated circuit; and
a hybrid electro-optical package, comprising:
a carrier substrate, said carrier substrate including a plurality of electrical vias and a plurality of optical vias, each of said plurality of electrical vias and said plurality of optical vias providing a passage through said carrier substrate between a back side and a front side of said carrier substrate;
a plurality of intra-package electrical interconnects, one of the intra-package electrical interconnects coupled to one of the electrical vias of said carrier substrate; and
a package base, said package base coupled to said carrier substrate by said plurality of intra-package electrical interconnects,
wherein a length of the carrier substrate overlaps an entire length of the package base,
wherein said carrier substrate is interconnected electrically with said array of opto-electronic components mounted on the back side of said carrier substrate, and includes a plurality of optical apertures at the front side of said carrier substrate for communication of optical signals through said plurality of optical vias to said array of opto-electronic components, and
wherein said package base is to provide for communication of electrical signals to said integrated circuit and said array of opto-electronic components disposed at the back side of said carrier substrate transmitted through a plurality of lands disposed at a front side of said package base.

10. The opto-electronic engine of claim 9, wherein an opto-electronic component of said array of opto-electronic components is selected from the group consisting of a vertical-cavity, surface-emitting laser (VCSEL), and a photo-diode.

11. The opto-electronic engine of claim 9, further comprising: a heat spreader coupled to a back side of an opto-electronic component of the array of opto-electronic components and a back side of said integrated circuit, said heat spreader to dissipate heat generated by said array of opto-electronic components and said integrated circuit, when said opto-electronic component and said integrated circuit are electrically powered.

12. The opto-electronic engine of claim 9,
wherein said plurality of optical apertures at the front side of said carrier substrate is to couple with an optical connector, and the plurality of electrical lands disposed at the front side of the package base is to couple with land grid array (LGA) connector of a package interposer mounted on a printed circuit board (PCB).

13. A system, comprising:
an optical bus; and
an opto-electronic engine, comprising:
an array of opto-electronic components;
an integrated circuit; and
a hybrid electro-optical package, comprising:
a carrier substrate, said carrier substrate including a plurality of electrical vias and a plurality of optical vias, each of said plurality of electrical vias and said plurality of optical vias providing a passage through said carrier substrate between a back side and a front side of said carrier substrate;
a plurality of intra-package electrical interconnects, one of the intra-package electrical interconnects coupled to one of the electrical vias of said carrier substrate; and
a package base, said package base coupled to said carrier substrate by said plurality of intra-package electrical interconnects,
wherein a length of the carrier substrate overlaps an entire length of the package base,
wherein said carrier substrate is interconnected electrically with said array of opto-electronic components mounted on the back side of said carrier substrate, and includes a plurality of optical apertures at the front side of said carrier substrate for communication of optical signals through said plurality of optical vias to said array of opto-electronic components,
wherein said package base is to provide for communication of electrical signals to said integrated circuit and said array of opto-electronic components disposed at the back side of said carrier substrate transmitted through a plurality of lands disposed at a front side of said package base, and
wherein said opto-electronic engine is interfaced to a plurality of bit-lines of said optical bus.

14. The system of claim 13, further comprising:
a package interposer, comprising:
a land grid array connector; and
an optical connector disposed along a side of said land grid array connector;
wherein said land grid array connector is interconnected with said plurality of lands disposed at the front side of said package base to provide for communication of electrical signals to said integrated circuit and said array of opto-electronic components; and
wherein said optical connector interconnects an optical waveguide comprising one of the bit-lines of said optical bus through an optical-waveguide ferrule to optical apertures at the front side of said carrier substrate to provide for communication of optical signals through said plurality of optical vias to said array of opto-electronic components.

15. The system of claim 13, further comprising:
an integrated combination of components selected from the group consisting of a digital-information processor comprising a plurality of components integrated with said optical bus and said opto-electronic engine wherein said optical bus and said opto-electronic engine are to transfer information between one component and another component coupled to said optical bus in said digital-information processor, and a data-processing center comprising a plurality of digital-information processors and wherein said optical bus and said opto-electronic engine are to transfer information between one digital-information processor and another digital-information processor coupled to said optical bus in the data-processing center.

* * * * *